(12) United States Patent
Ohmi et al.

(10) Patent No.: US 7,474,383 B2
(45) Date of Patent: Jan. 6, 2009

(54) MASK MAKING METHOD, MASK MAKING DEVICE, AND MASK DRAWING DEVICE

(75) Inventors: Tadahiro Ohmi, Miyagi (JP); Shigetoshi Sugawa, Miyagi (JP); Kiwamu Takehisa, Miyagi (JP)

(73) Assignees: Tadahiro Ohmi, Sendai-Shi (JP); Foundation For Advancement Of International Science, Tsukuba (JP)

( * ) Notice: Subject to any disclaimer, the term of this patent is extended or adjusted under 35 U.S.C. 154(b) by 188 days.

(21) Appl. No.: 10/543,454

(22) PCT Filed: Jan. 28, 2004

(86) PCT No.: PCT/JP2004/000740

§ 371 (c)(1),
(2), (4) Date: Oct. 21, 2005

(87) PCT Pub. No.: WO2004/074934

PCT Pub. Date: Sep. 2, 2004

(65) Prior Publication Data

US 2006/0132591 A1  Jun. 22, 2006

(30) Foreign Application Priority Data

Jan. 28, 2003 (JP) ............................. 2003-018960
Mar. 20, 2003 (JP) ............................. 2003-078951

(51) Int. Cl.
G03B 27/54 (2006.01)
G03B 27/52 (2006.01)
(52) U.S. Cl. .......................................... 355/67; 355/55
(58) Field of Classification Search .................. 355/69, 355/67, 53, 72, 75, 55, 77; 359/858, 365, 359/855, 298; 353/122
See application file for complete search history.

(56) References Cited

U.S. PATENT DOCUMENTS

| | | | |
|---|---|---|---|
| 5,208,818 A | 5/1993 | Gelbart et al. | |
| 5,870,176 A | 2/1999 | Sweatt et al. | |
| 6,211,948 B1 | 4/2001 | Lüllau et al. | |
| 6,312,134 B1 | 11/2001 | Jain et al. | |
| 6,425,669 B1 | 7/2002 | Mei et al. | |
| 6,515,734 B1 | 2/2003 | Yamada et al. | |
| 2001/0002155 A1 | 5/2001 | Takahashi et al. | |
| 2001/0028495 A1* | 10/2001 | Quate et al. | 359/298 |
| 2003/0206281 A1* | 11/2003 | Jain | 355/53 |

FOREIGN PATENT DOCUMENTS

JP  6-236020  8/1994

(Continued)

OTHER PUBLICATIONS

T. Sandstrom et al., Micro Laser Systems AB, Electronic Journal, Jul. 2001, pp. 140-142.

*Primary Examiner*—Peter B Kim
(74) *Attorney, Agent, or Firm*—Foley & Lardner LLP

(57) ABSTRACT

Laser light in a pattern reflected by a two-dimensional array micromirror 106 that is controlled on the basis of mask data of a mask pattern data output device 107 forms an enlarged pattern 110. This enlarged pattern is projected in a reduced manner onto a mask substrate 109 through a reduction-projection optical system 102, thereby forming a lithography pattern 111. Since a large number of patterns are written in an instant by the two-dimensional array micromirror 106, a time required for lithography the entire mask pattern is extremely shortened as compared with a conventional one. As a result, the mask cost can be largely reduced.

20 Claims, 11 Drawing Sheets

FOREIGN PATENT DOCUMENTS

| | | |
|---|---|---|
| JP | 7-135165 | 5/1995 |
| JP | 8-203799 | 8/1996 |
| JP | 2000-098230 | 4/2000 |
| JP | 2001-168003 | 6/2001 |
| JP | 2001-313251 | 11/2001 |
| JP | 2002-372791 | 12/2002 |

\* cited by examiner (a)

410    411

(b)

420    421

(c)

430    431

MASK MAKING METHOD, MASK MAKING DEVICE, AND MASK DRAWING DEVICE

This application is a National Stage application of PCT/JP2004/000740 filed Jan. 28, 2004, which claims priority from Japanese patent applications JP 2003-018960, filed Jan. 28, 2003 and JP 2003-078951, filed Mar. 20, 2003. The entire contents of each of the aforementioned applications are incorporated herein by reference.

TECHNICAL FIELD

This invention relates to a method of writing a mask for use in an exposure process at the time of manufacturing a semiconductor integrated circuit and to a system for writing the mask. An objective mask according to this invention may be, for example, either a photomask for photolithography that uses ultraviolet-ray radiation or X-ray radiation as an exposure light source or an electron-beam proximity mask.

BACKGROUND ART

Generally, in order to write a mask (may be called a reticle also) that is used in manufacturing a semiconductor integrated circuit, it is necessary to provide, on the surface of a quartz plate or the like which will serve as a substrate of the mask, a chromium film or the like that shields exposure light in a pattern corresponding to an intended circuit pattern. This chromium film or the like is patterned by exposure and the general technique of exposing a pattern by lithography is known as electron-beam lithography that uses an electron beam. As is readily understood from the fact that such lithography is called electron-beam direct lithography or drawing, the lithography is carried out by moving a narrowed electron beam along the pattern and, as a result, is executed by a system that is normally called an EB lithography system.

In a general exposure system using ultraviolet light, a mask is used which has a size that is equal to four or five times a circuit pattern size of a semiconductor chip to be manufactured. On the other hand, there is also an exposure method that uses a mask having the same size as that of a circuit pattern of a semiconductor chip (hereinafter, this mask will be referred to as a proximity mask). This is called proximity exposure and may be called, for example, LEEPL (first letters of Low Energy E-Beam Proximity Lithography), proximity X-ray exposure, and so on. Further, in this exposure technique, the proximity mask is disposed immediately above or proximate to a wafer. The exposure is carried out by irradiating an electron beam in the case of the LEEPL or an X-ray in the case of the proximity X-ray exposure through the mask.

On the other hand, a mask writing system has been also manufactured and sold, that is based on a technique that performs pattern lithography (i.e. exposing in a pattern onto a mask substrate applied with a resist) by the use of laser light in the ultraviolet region (hereinafter abbreviated as ultraviolet laser light), instead of the electron beam (this system is sometimes called a laser-beam lithography system). There are two types in structure with respect to this system. One is such that the pattern lithography is performed on the mask substrate by applying thereto ultraviolet laser light in the form of one beam or divided into a plurality of beams. As the other structure, use is made of reflector display elements that are composed of a large number of micromirrors arranged two-dimensionally and that are called digital micromirror devices or the like. The pattern lithography is performed on the mask substrate by irradiating ultraviolet laser light onto the reflector display elements and by controlling a pattern of reflected light. This laser-beam lithography system can expose a partial pattern of a circuit pattern at a time and therefore has a feature that the processing speed is fast, as known in the art. Description is given about this, for example, in the July 2001 issue of Electronic Journal, pp. 140-142.

DISCLOSURE OF THE INVENTION

What has been widely pointed out in recent years as a problem in the mask writing is a price rise in mask. The reason therefor is that the amount of information of a mask pattern becomes enormous in order to cope with semiconductors that are highly integrated and miniaturized year by year so that a lithography time required by the general EB lithography system reaches from several tens of hours to even several hundreds of hours per mask. Since the EB lithography system is an extremely expensive system costing several hundred million yen to several thousand million yen or more per system, it is actually difficult to provide or prepare a number of such systems. Since the system is occupied for a long time during writing a single mask, it is anticipated that, in consideration of cost depreciation and so on, the price of a mask with a design rule in the generation of 0.10 μm or less reaches to as high as about ten times the general mask price up to the generation of 0.18 μm.

On the other hand, in the foregoing laser-beam lithography system using the micromirrors arranged in the two-dimension, it is necessary to move the mask substrate after the partial pattern is exposed at a time to expose an adjacent partial pattern. However, there has been a problem that it is difficult to enhance the accuracy of such movement and therefore not possible to cope with the miniaturization. Specifically, in the case where the minimum line width of a chip to be manufactured is 0.18 μm, if the mask magnification is four times, the moving accuracy of the mask substrate (i.e. moving accuracy of a stage having the mask substrate placed thereon) should be about 0.07 μm or less, i.e. at least $\frac{1}{10}$ of a minimum line width of 0.72 μm in the mask, and the mask substrate should be moved instantaneously with such an moving accuracy, which has been difficult. This is because distance measurement for the position of the stage takes time for precisely moving it with a high accuracy of about 0.07 μm.

On the other hand, with respect to the exposure technique using the proximity mask, it has been considered that since the area of the mask is small, the mask can be manufactured in a relatively short time and therefore the cost of the mask can be reduced. However, since the line width of a pattern is required to have a small value of about 0.07 μm or less that is substantially equal to that of an actual chip, when the mask is written by the use of the EB lithography system, it has been difficult to achieve a high writing accuracy.

Further, if a proximity mask is used for lithography by the use of the foregoing laser-beam lithography system, the moving accuracy of a mask substrate becomes 0.007 μm, i.e. $\frac{1}{10}$ or less of the foregoing minimum line width. It is almost impossible to move a stage in an instant with this accuracy. Therefore, with respect to the proximity mask, it has been a problem that there is no mask lithography system that can perform lithography at a high speed.

Moreover, there is also the following problem with respect to the conventional laser-beam lithography system. Specifically, in a configuration where a mirror device is projected onto a mask substrate at a high reduction ratio like in the conventional laser-beam lithography system, the projection size of the mirror device on the mask substrate becomes small like 0.05×0.2 mm as shown in FIG. 10 and, therefore, in order to delineate over the whole surface of the mask substrate, such a small pattern should be scanned and stepped. For example, in order to delineate a general 6-inch mask (long side 152 mm and short side 100 mm as a lithography area), the number of scan times reaches as many as 760 (=152/0.2) (i.e. stepping 760 times) when scanning is carried out in the short-side direction of the mirror device. In order to facilitate understanding, it is shown in FIG. 10 that a projection pattern is scanned, but, actually, a projection pattern is fixed while the mask substrate is scanned.

According to this technique, stitching exposure over the length of 100 mm of the short side is required in adjacent areas of scanning. However, this has encountered a difficulty to perform accurately. That is, the positional accuracy of a pattern of a mask is generally 10 nm or less on the mask, which is as small as $1/10$ or less of the minimum line width. Therefore, in order to reduce the error to $1/10$ or less in the stitching exposure, a positional accuracy of 1 nm or less is required. However, it has been almost impossible to step the stage with such a high accuracy.

As described above, in the conventional laser-beam lithography system, there is required the exposure that carries out the stitching with the extremely high accuracy over the long area of about 100 mm and there are the cases where a pattern is distorted at a stitched portion.

It is an object of this invention to provide a mask writing method and a mask writing system that can manufacture a mask in a short time with a high accuracy, thereby solving the conventional problems as described above.

It is another object of this invention to provide a system that can remarkably improve the stitching accuracy and that can delineate a mask at a high speed.

In order to achieve the above-mentioned objects, this invention provides a method of writing a mask for use in manufacturing a semiconductor device, characterized by using a mask pattern projecting apparatus using light control elements arranged in a two-dimensional array and a reduction-projection optical apparatus, controlling the light control elements based on mask pattern data to thereby output a first mask pattern from the mask pattern projecting apparatus, and inputting the first mask pattern into the reduction-projection optical apparatus to thereby form a reduced second mask pattern.

This invention also provides a method of writing a mask for use in manufacturing a semiconductor device, characterized by using a mask pattern projecting apparatus using light control elements arranged in a two-dimensional array, a first reduction-projection optical apparatus, and a second reduction-projection optical apparatus, controlling the light control elements based on mask pattern data to thereby output a first mask pattern from the mask pattern projecting apparatus, inputting the first mask pattern into the first reduction-projection optical apparatus to thereby form a reduced second mask pattern, and inputting the second mask pattern into the second reduction-projection optical apparatus to thereby form a further reduced third mask pattern.

According to each of these methods, the mask is not directly written by the use of the first pattern formed by the light control elements arranged in the two-dimensional array, but is written by the use of the reduced second pattern or the further reduced third pattern. Therefore, the size of the first pattern can be set large. As a result, the moving accuracy when forming the first pattern can be increased (i.e. with a low accuracy) even by approximately one figure. Therefore, it can be moved in an instant so that a time required for lithography the whole can be shortened.

As the light control elements arranged in the two-dimensional array, use may be made of a liquid crystal display element or a reflector display element, such as a digital micromirror or a digital mirror device, using a two-dimensional array micromirror, or use may be made of self-light-emitting elements such as plasma elements, fluorescent elements, phosphorescent elements, organic EL elements or inorganic EL elements. Further, according to another mode of this invention, there is obtained a mask lithography system formed by providing a plurality of pattern projecting apparatuses each using light control elements arranged in a two-dimensional array, such as a mirror device, and a microlens array. According to this mask lithography system, a large number of lights proceeding from the light control elements arranged in the two-dimensional array pass through the microlens array so as to be projected onto a mask substrate as microspots. Therefore, the size of the mirror device projected onto the mask substrate is not required to be small. That is, since it is not necessary to perform projection at a high reduction ratio, the projected size of the mirror device can be increased to about one-severalth of the width or the outer diameter of the pattern projecting apparatus. By this, it becomes easy to scan the mask substrate such that exposure areas caused by two patterns projected from the adjacent pattern projecting apparatuses are connected to each other. Therefore, the whole surface of the mask can be written only by scanning the mask substrate once. Consequently, there is no occurrence of an connection error that is caused when stepping the mask substrate as conventionally and further the mask can be written at a high speed.

BEST MODE FOR CARRYING OUT THE INVENTION

Hereinbelow, embodiments of this invention will be described with reference to the drawings.

Figure 1:
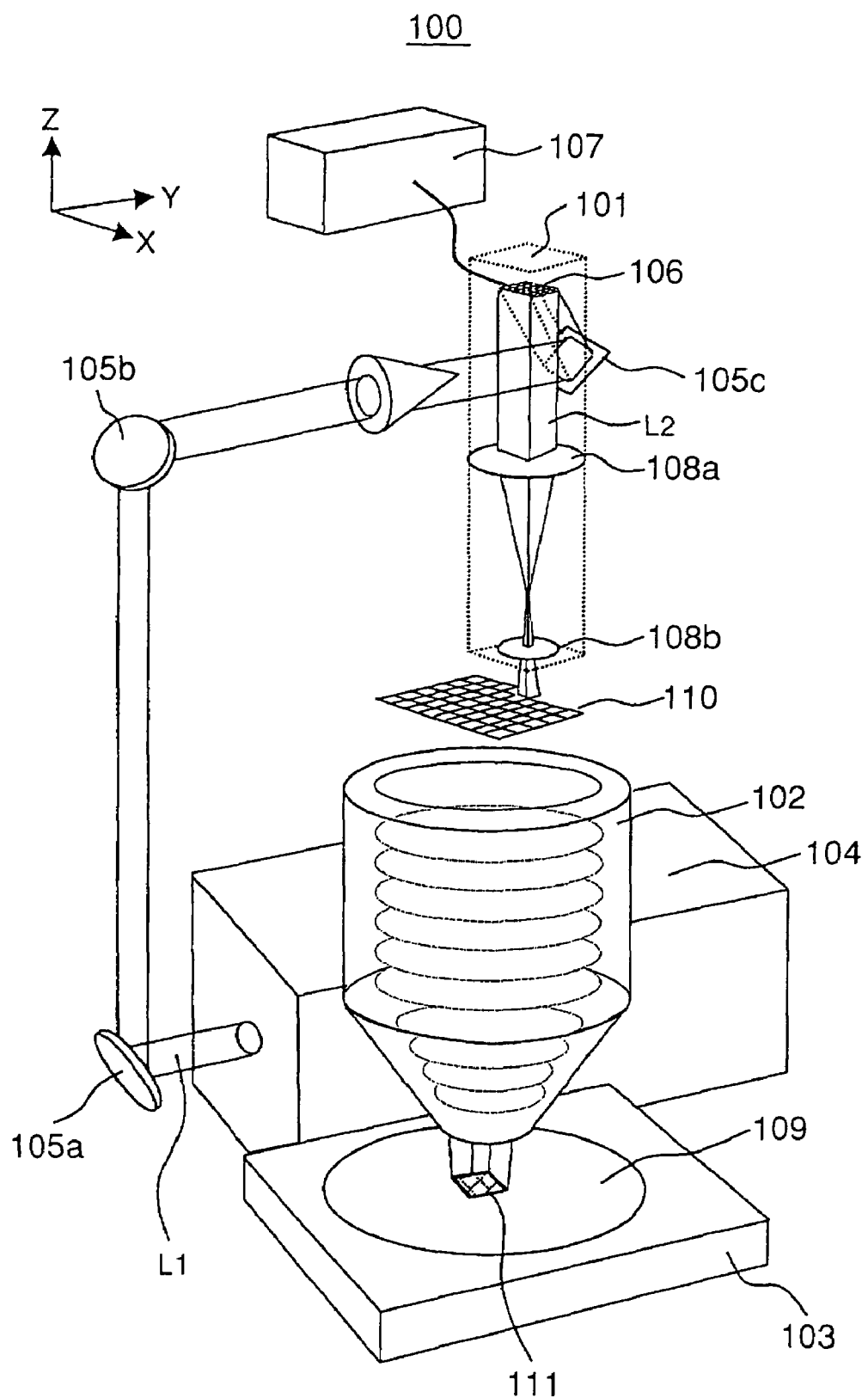
FIG. 1 is an overall structural diagram of a mask writing system according to a first embodiment of this invention.

FIG. 1 is a structural diagram of a mask writing system 100 according to a first embodiment of this invention. The mask writing system 100 comprises an enlarged-pattern generating portion 101 having a two-dimensional array micromirror 106 that can form an optional pattern, a reduction-projection optical system 102, a stage 103 having a mask substrate 109 placed thereon, and an ultraviolet laser oscillator 104 for generating laser light L1 in the ultraviolet wavelength region to which a resist applied to the mask substrate 109 is sensitive.

The laser light L1 extracted from the ultraviolet laser oscillator 104 is reflected by mirrors 105a and 105b and is projected onto a mirror 105c in the enlarged-pattern generating portion 101 so as to be irradiated onto the two-dimensional array micromirror 106.

In the two-dimensional array micromirror 106, micromirrors are individually controlled by data given from a mask pattern data output device 107 so that the micromirrors are controlled to form a partial pattern of an intended mask lithography pattern. The laser light incident upon the mirrors forming the partial pattern of the lithography pattern, after reflected here, proceeds downwardly like laser light L2 shown in the figure and passes through a lens 108a and a lens 108b so that an image of the two-dimensional array micromirror 106 is projected onto a part of a portion indicated as an enlarged pattern 110 in the figure. That is, the lens 108a and the lens 108b form a projection optical system.

Since the pattern formed by the two-dimensional array micromirror 106 is part of the intended mask lithography pattern, the enlarged-pattern generating portion 101 as a whole is configured to be slightly movable in X- and Y-directions in FIG. 1 in order to form the overall enlarged pattern 110 which is an enlarged form of the intended mask lithography pattern.

The enlarged pattern 110 is projected onto a lithography area of the mask substrate 109 on the stage 103 through the reduction-projection optical system 102. By this manner, a lithography pattern 111 in a reduced form of the enlarged pattern 110 is delineated on the mask substrate 109. As the enlarged pattern 110, an actual mask may be written at that position or it may be a spatial pattern in the form of a patterned aggregate of ultraviolet light. With respect to the structure of the enlarged-pattern generating portion 101, use may be made of a structure as described in the foregoing literature, U.S. Pat. No. 5,870,176, 6,312,134, or 6,425,669, or the like. As shown in this embodiment, the mask writing system 100 of this invention uses the two-dimensional array micromirror 106 as light control elements arranged in a two-dimensional array which forms the structure of this invention. With this structure, the pattern of part of the intended mask lithography pattern is generated by the use of the two-dimensional array micromirror 106 and the enlarged-pattern generating portion 101 itself moves while changing a pattern upon occasion, so that the pattern which is the same as the lithography pattern is formed as the enlarged pattern 110. However, since the enlarged pattern 110 itself is larger than the actual mask, the lithography pattern having the same size as the actual mask is generated by the use of the reduction-projection optical system 102.

As described above, according to this invention, the provision of the reduction-projection optical system 102 makes it possible to first generate the pattern which is the same as the mask lithography pattern but is enlarged. Therefore, use can be made of micromirrors having a size sufficiently larger than the line width of an actual mask pattern and thus a commercial digital mirror device or the like can be utilized.

Description will be given by applying actual dimensions to this embodiment. For example, it is assumed that a quadruple mask for a semiconductor integrated circuit with a minimum line width of 0.18 µm is written. In this case, the minimum line width of the lithography pattern 111 becomes 0.72 µm, while, if the reduction ratio of the reduction-projection optical system 102 is equal to five, the minimum line width in the enlarged pattern 110 becomes equal to 3.6 µm. Therefore, the accuracy in successively moving the enlarged-pattern generating portion 101 may be enough to be about 0.36 µm which is about ¹⁄₁₀ of such a value. Since this is as many as five times the moving accuracy 0.07 µm in the conventional system, the distance measurement is facilitated and thus the high-speed movement is made possible.

Moreover, by increasing the reduction ratio of the projection optical system formed by the lens 108a and the lens 108b in the enlarged-pattern generating portion 101, the enlarged pattern 110 itself can be reduced to four to five times an actual semiconductor integrated circuit pattern. As a result, by further reducing it to ¼ to ⅕ by the use of the reduction-projection optical system 102, the lithography pattern can be formed as a pattern having the same size as the actual semiconductor integrated circuit. Consequently, it also becomes possible to write a proximity mask with a high accuracy according to this invention.

On the other hand, if an excimer laser (e.g. KrF excimer laser or ArF excimer laser) is used as the ultraviolet laser oscillator 104 in this embodiment, a reduction-projection optical system for an excimer exposure apparatus (i.e. KrF exposure apparatus or ArF exposure apparatus), as it is, can be used as the reduction-projection optical system 102 forming this invention. However, since laser light from the excimer laser is pulse laser light, its energy is high so that there is a case where the two-dimensional array micromirror 106 forming this invention is damaged.

In view of this, as another embodiment of this invention, an argon ion laser is used as the ultraviolet laser oscillator 104. The argon ion laser performs laser oscillation at many wavelengths simultaneously. If, among them, only the wavelength 363.8 nm in particular is selected and used, since it is quite close to a wavelength 365 nm of an i-line of a mercury lamp, it is possible to use a resist for the i-line. Further, a reduction-projection optical system for an i-line exposure apparatus, as it is, can be used as the reduction-projection optical system 102 forming this invention. Moreover, since the argon ion laser performs continuous oscillation, the two-dimensional array micromirror 106 forming this invention is not damaged.

Figure 2:
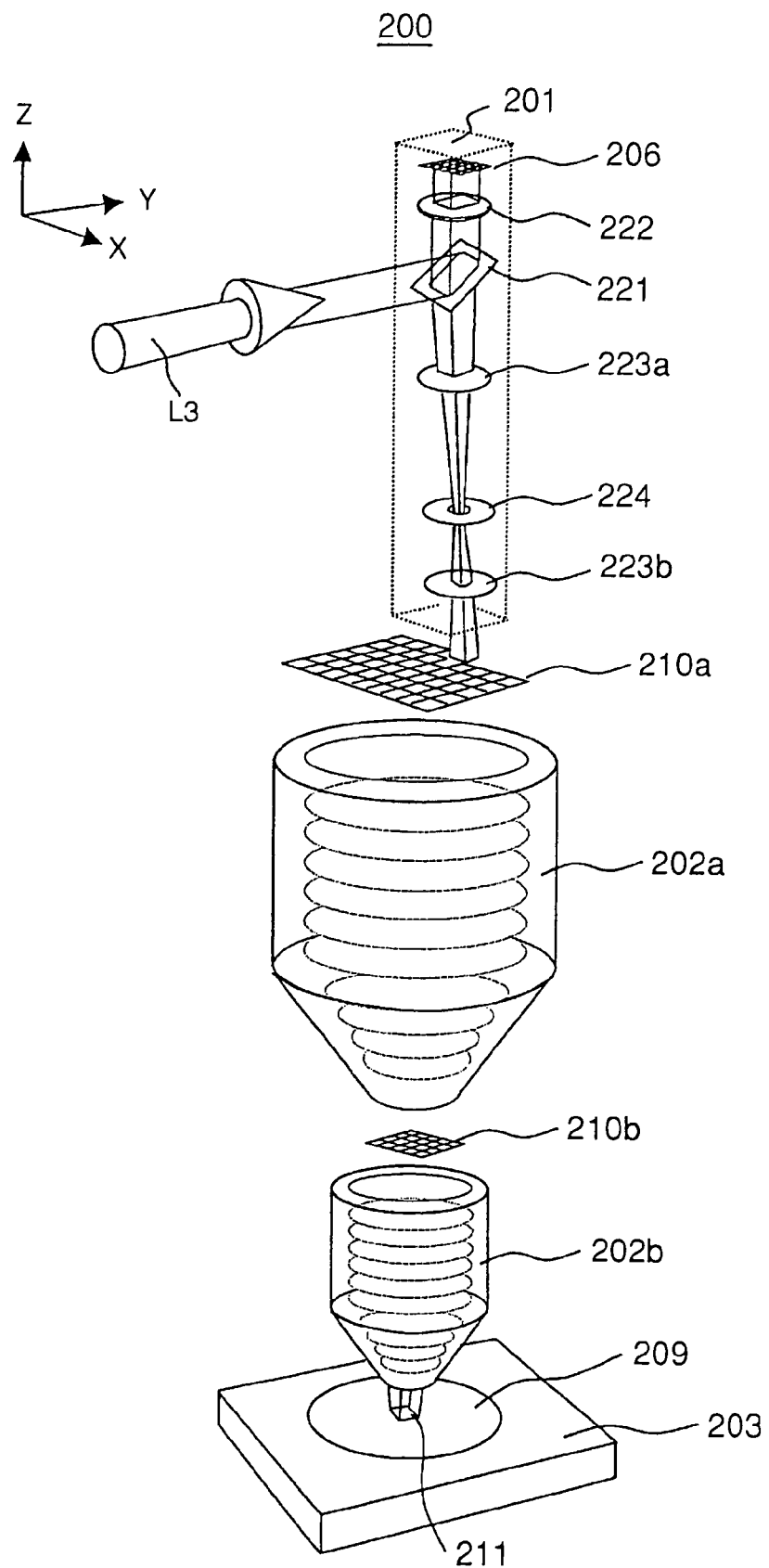
FIG. 2 is an overall structural diagram of a mask writing system according to a second embodiment of this invention.

FIG. 2 is a structural diagram of a mask writing system 200 according to a second embodiment of this invention. As compared with the mask writing system 100 shown in FIG. 1, this embodiment differs in two points which will be described hereinbelow. The other basic structure is the same. Although use is made of an ultraviolet laser oscillator for generating laser light in the ultraviolet region and a pattern data output device, they are omitted in FIG. 2. The different points are a control system for ultraviolet laser light in an enlarged-pattern generating portion 201 and a structure of a reduction-projection optical system.

Laser light L3 is incident upon a beam splitter 221 in the enlarged-pattern generating portion 201 and is reflected upward to pass through a wavelength plate 222 so as to be incident upon a two-dimensional array micromirror 206. Laser light reflected by micromirrors corresponding to a pattern forming part of an intended mask lithography pattern in the two-dimensional array micromirror 206 passes through a lens 223a and then passes through an aperture 224 (a plate formed with a microhole). On the other hand, laser light reflected by micromirrors, which serves not to form the mask lithography pattern in the two-dimensional array micromirror 206 is stopped by the aperture 224 because of slight deflection of a reflection angle. The wavelength plate 222 serves to convert linearly polarized laser light reflected from the beam splitter 221 into circularly polarized laser light. When the laser light passes again through the wavelength plate 222 after reflected by the two-dimensional array micromirror 206, since the polarization direction becomes perpendicular to the original polarization direction, 99% or more of the laser light is transmitted (i.e. goes straight on) through the beam splitter 221.

In this embodiment, the reduction-projection optical system of this invention has a two-stage structure composed of a first reduction-projection optical system 202*a* and a second reduction-projection optical system 202*b*. Therefore, a first enlarged pattern 210*a* formed before the first reduction-projection optical system 202*a* is a huge mask having each side of about 128 cm. Therefore, a second enlarged pattern having each side of about 32 cm is formed through the first reduction-projection optical system 202*a*. Then, through the second reduction-projection optical system 202*b*, a lithography pattern 211 having each side of about 8 cm, which is four to five times a normal size, is formed on a mask substrate 209 on a stage 213.

As a feature of this embodiment, since use is made of the reduction-projection optical systems in two stages, the line width in the first enlarged pattern 210*a* can be thickened as many as 64 to 80 times a size of an actual semiconductor integrated circuit (i.e. a wafer size) and, therefore, even if this is not formed with a particularly high accuracy, the dimensional accuracy of the lithography pattern 211 finally formed after twice reduction is extremely improved. Further, since positioning of an enlarged-pattern generating portion 201 does not require a high accuracy and thus it can be moved at a high speed, the lithography speed is further improved.

After all, in this embodiment, as compared with the first embodiment where the single reduction-projection optical system is used as shown in FIG. 1, a tolerance of moving error of the enlarged-pattern generating portion 201 can be further increased by four to five times and therefore it can be moved at a higher speed so that a mask can be written in a shorter period of time.

Figure 3:
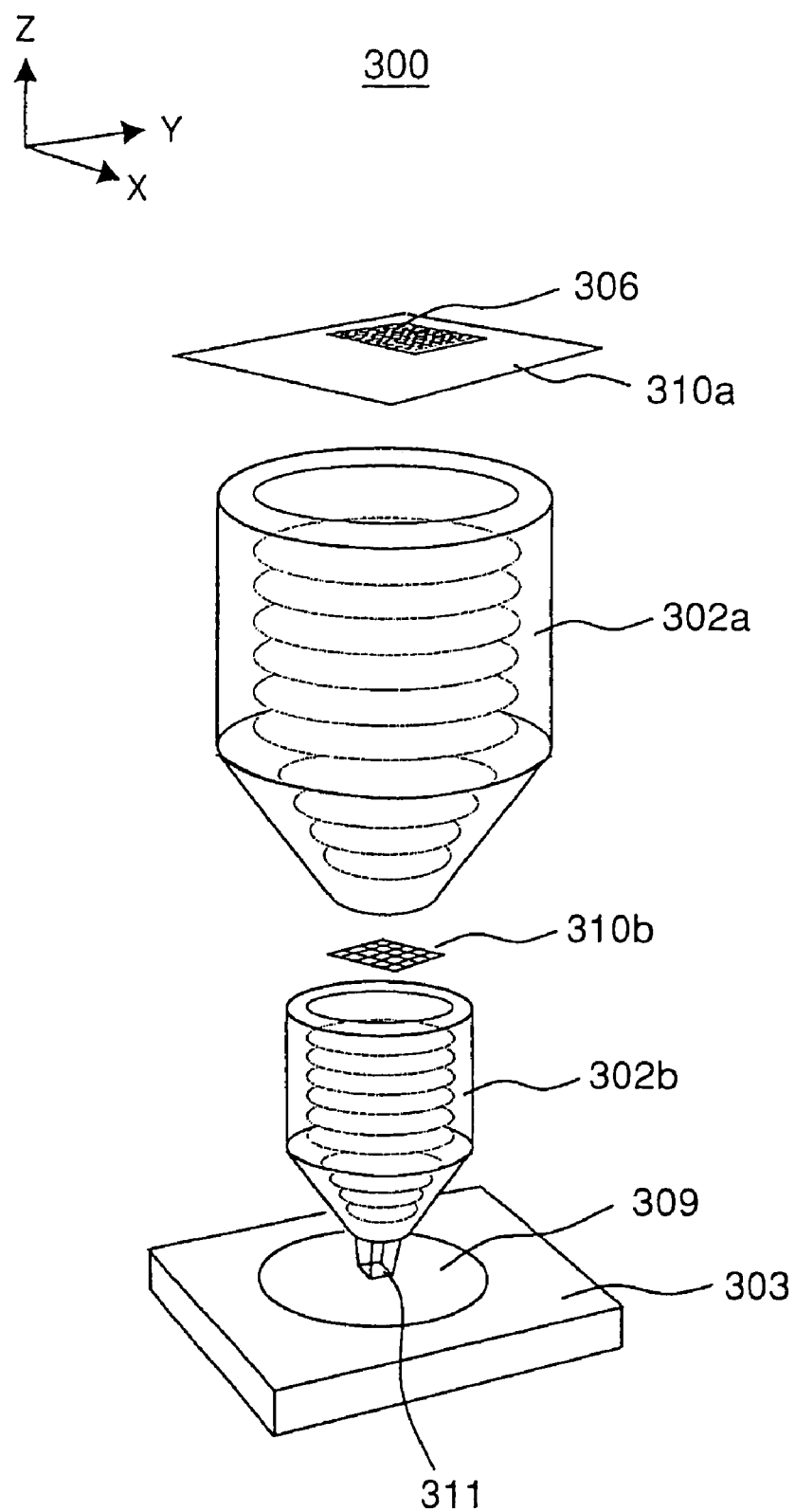
FIG. 3 is an overall structural diagram of a mask writing system according to a third embodiment of this invention.

FIG. 3 is a structural diagram of a mask writing system 300 according to a third embodiment of this invention. In the mask writing system 300, a two-dimensional array self-light-emitting device 306 is used as light control elements arranged in a two-dimensional array, which forms this invention. In the two-dimensional array self-light-emitting device 306, only those elements corresponding to a pattern of part of an intended mask lithography pattern are caused to emit light. Then, a light-emission pattern thereof is reduced through a first reduction-projection optical system 302*a* and a second enlarged pattern 310*b* is reduced through a second reduction-projection optical system 302*b* so that a lithography pattern 311 is formed on a mask substrate 309 on a stage 303. The two-dimensional array self-light-emitting device 306 can be scanned in X- and Y-directions in the figure, thereby constituting a first enlarged pattern 310*a* formed with the entire lithography pattern.

As the two-dimensional array self-light-emitting device 306 used in this embodiment, self-light-emitting elements like those used in PDP (Plasma Display Panel) for use in a large-size flat panel display or the like, EL (Electroluminescence), LED, or the like are suitable. Although these displays normally use three primary colors of light, i.e. red, green, and blue, since the elements are used as an exposure light source in this embodiment, only those elements that emit single-color light are sufficient. However, it is preferable to use a material that emits light with a wavelength as short as possible and therefore it is appropriate to use a material that strongly emits light around 365 nm (wavelength of i-line) of a mercury lamp. The reason therefor is that a resist for the i-line, as it is, can be used as a resist applied to the mask substrate. Use may be made of not only the self-light-emitting elements but also liquid crystals whose light emission is controlled by a backlight, or a reflector display element such as a digital micromirror or a digital device.

Like in the second embodiment, the first enlarged pattern has a size with each side of about 128 cm and the second enlarged pattern has a size with each side of about 32 cm. As a result, a pattern corresponding to a normal quadruple or quintuple mask can be formed as the lithography pattern 311.

In this embodiment, a third reduction-projection optical system may further be used similarly, thereby being applicable to writing of a proximity mask.

Figure 4:
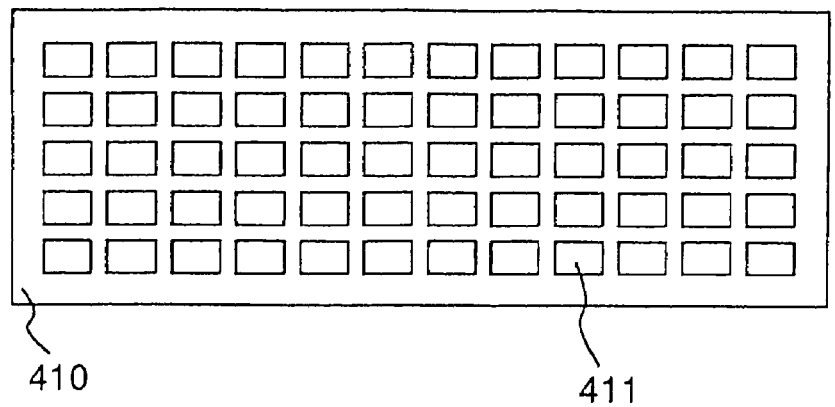
FIGS. 4(a), (b), and (c) are diagrams showing arrays of light control elements that are used in this invention.
Figure 4:
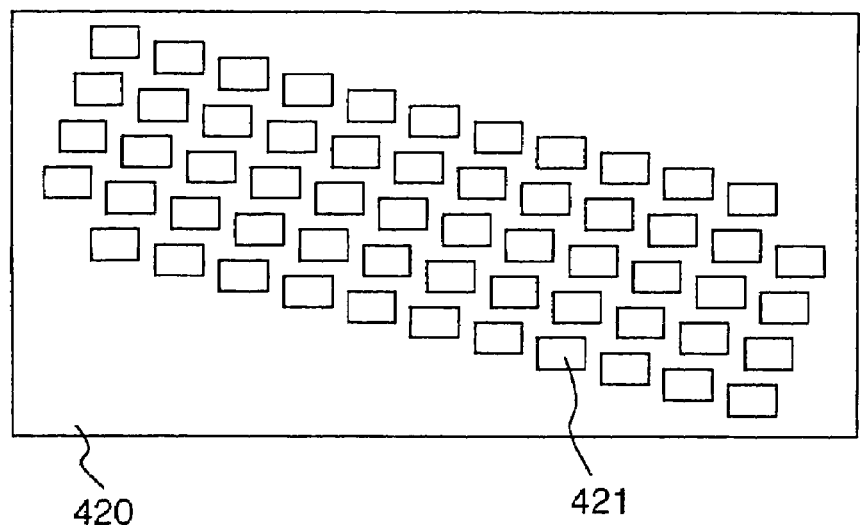
Figure 4:
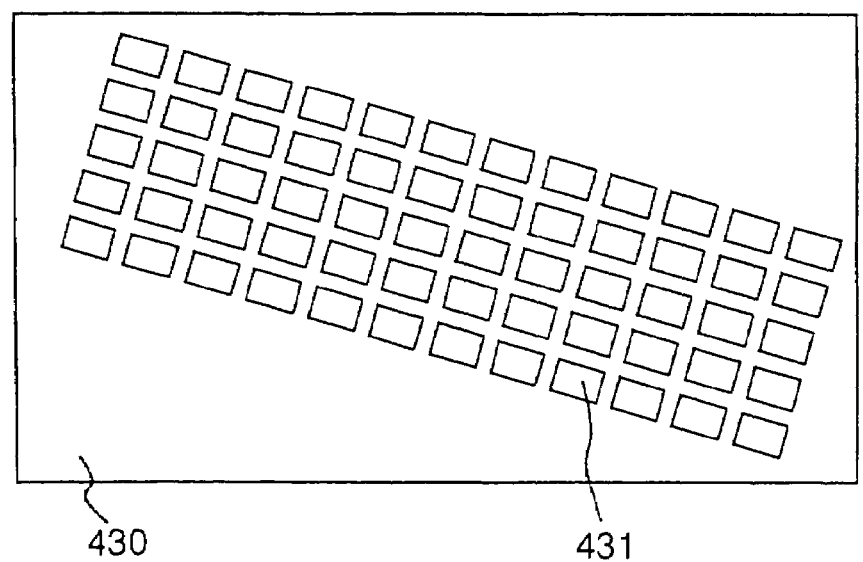

As the light control elements in the first to third embodiments, use may be made of a two-dimensional array light control element 410 in which light control elements 411 are simply arranged vertically and horizontally as shown in FIG. 4 at (a), while, use may also be made of a two-dimensional array light control element 420 in which adjacent light control elements 421 are arranged so as to be slightly staggered from each other as shown at (b), or a two-dimensional array light control element 430 in which light control elements 431 are arranged obliquely as shown at (c). By using the array structure of (b) or (c), when the light control elements are scanned, there exist no gaps between respective exposed portions on the mask substrate corresponding to the respective elements, and therefore, it does not occur that a line is broken or an oblique line is stepped in the lithography pattern so that the resolution can be improved.

Figure 5:
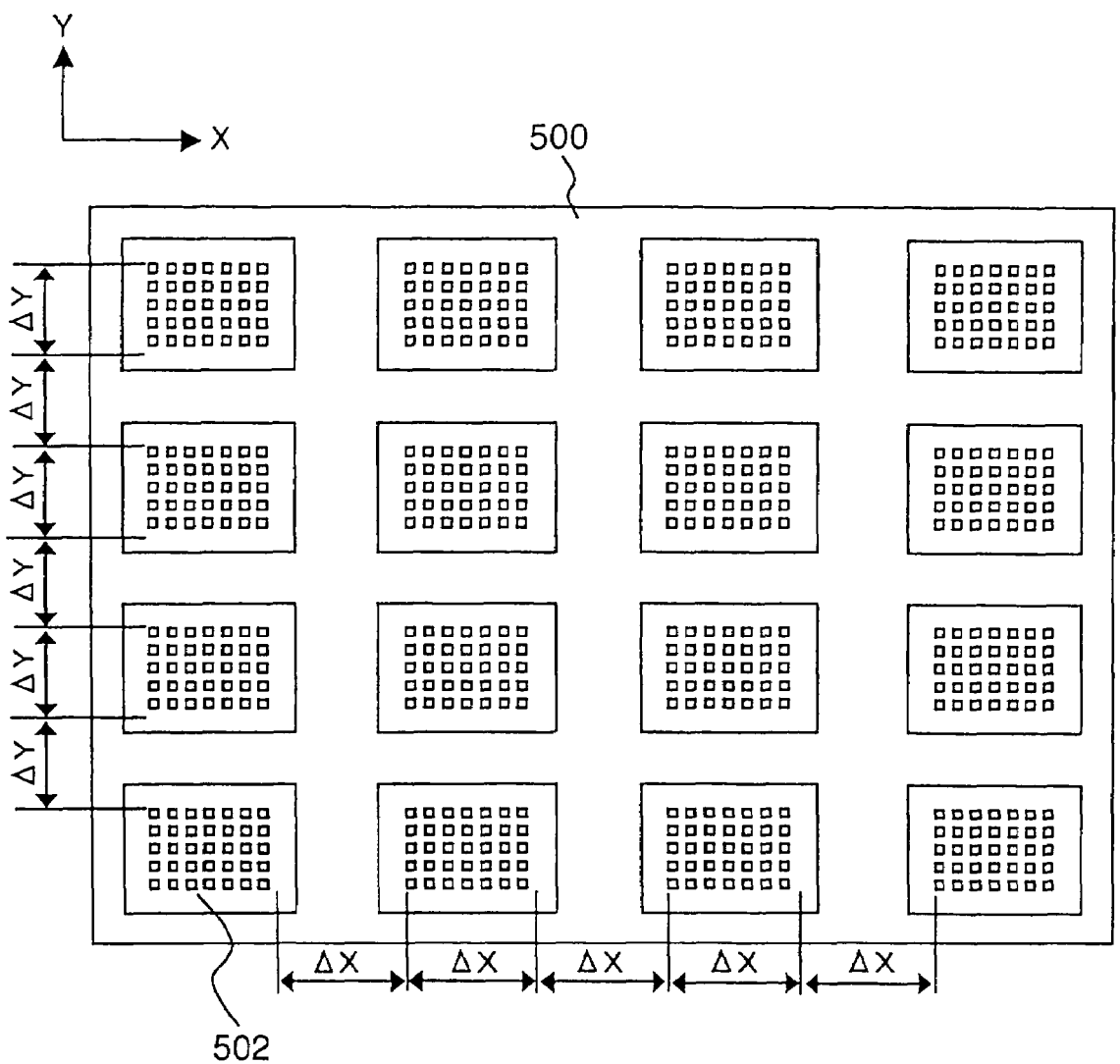
FIG. 5 is a plan view showing another array of a self-light-emitting device.

Further, instead of the two-dimensional array self-light-emitting device in the mask writing system 300 according to the third embodiment of this invention shown in FIG. 3, use may be made of a two-dimensional array self-light-emitting device 500 shown in FIG. 5. The two-dimensional array self-light-emitting device 500 is in the form of a number of normal two-dimensional array self-light-emitting devices 502 that are arrayed to form one device. In order to form the first enlarged pattern shown in FIG. 3 by the use of it, the two-dimensional array self-light-emitting device 500 is moved by a length of an array of light-emitting devices in one two-dimensional array self-light-emitting device 502 so as to be scanned so that a pattern corresponding to a large number of light-emitting devices can be formed at a time. That is, in the figure, at the time of scanning in the X-direction, it is sufficient to move by $\Delta X$, while, at the time of scanning in the Y-direction, it is sufficient to move by $\Delta Y$.

Hereinbelow, still other embodiments of this invention will be described with reference to the drawings. In each of the foregoing embodiments, the description has made about the method of writing a mask quickly by the use of the single mask writing system. However, in order to write a mask at a high speed, it is also possible to use a plurality of pattern lithography apparatuses.

Figure 6:
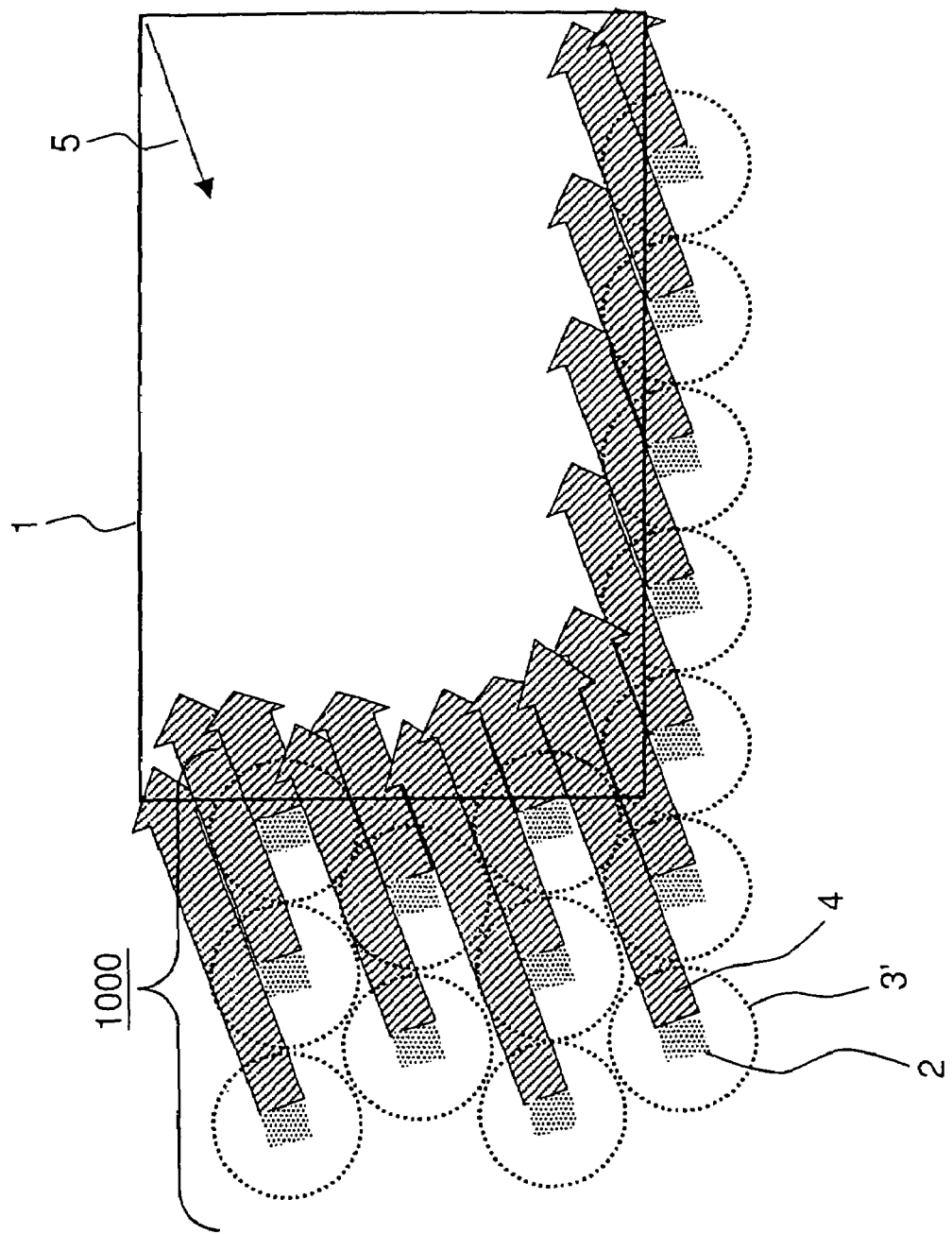
FIG. 6 is a diagram for explaining an operation in a mask lithography system according to another embodiment of this invention.
Figure 7:
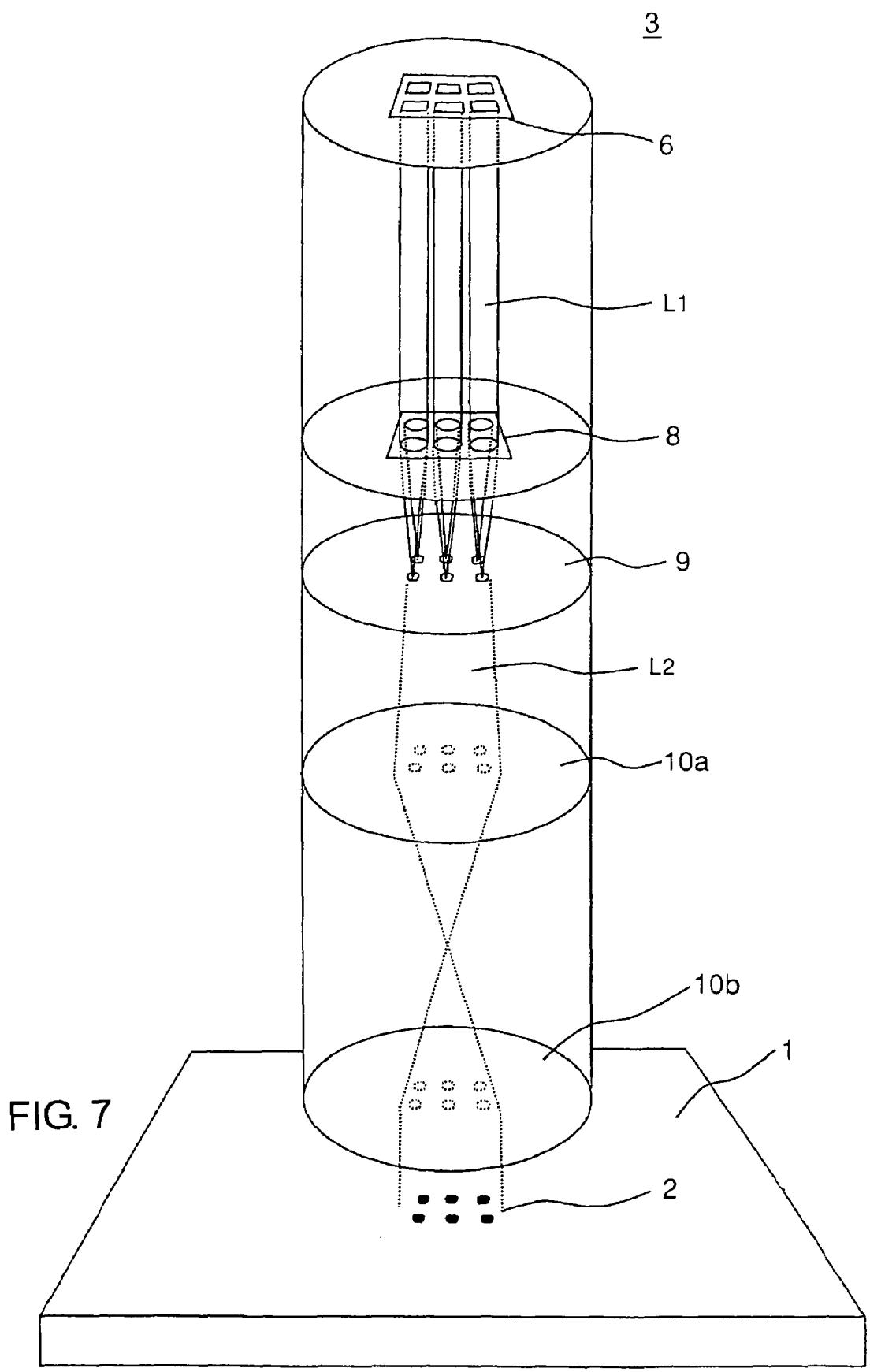
FIG. 7 is a structural diagram of a pattern projecting apparatus used in the pattern lithography system shown in FIG. 6.

Another embodiment according to this invention will be described with reference to FIGS. 6 and 7. FIG. 6 is an explanatory diagram of lithography by a mask lithography system 1000 according to the embodiment of this invention and FIG. 7 is a structural diagram of one set of a pattern projecting apparatus 3 included in the mask lithography system 1000. With respect to a mask substrate 1 as a lithography object, a pattern of a mirror device 6 in the form of light control elements arranged in a two-dimensional array is projected onto a mirror device projection area 2 as luminous flux. Herein, the mirror device 6 has a size of 15×12 mm wherein 1000×800 micromirrors 7 are arrayed. That is, the micromirrors are arranged vertically and horizontally at a 15-micron pitch.

The pattern shown in the mirror device projection area 2 is an aggregate of microspots as will be described hereinbelow.

Specifically, as shown in FIG. 7, in the pattern projecting apparatus 3 covered with a cylindrical body, laser light L1 proceeding from the mirror device 6 passes through a microlens array 8 so as to be condensed to small spots, then laser light L2 exiting through holes of a pinhole plate 9 passes through a lens 10a and a lens 10b so as to be projected onto the mask substrate 1. The lenses 10a and 10b are configured to be a 1:1 projection optical system and thus serve to project an image of light at the position of the pinhole plate 9 onto the mask substrate 1 on the same scale. Accordingly, the mirror device projection area 2 is in the form of the aggregate of the small light spots arranged in a two-dimensional array. The size of the whole thereof is the same as that of the mirror device 6 and it is not necessary to reduce it to 1 mm or less like a projected pattern by the use of the conventional laser-beam lithography system. Although six micromirrors are shown as the mirror device 6 in FIG. 7 in order to facilitate understanding, the number thereof is actually 800 thousands as described before.

In FIG. 6, the outer periphery of each pattern projecting apparatus 3 covered with the cylindrical body is indicated by 3'. The outer diameter of this cylinder is naturally greater than the size of the mirror device 6 mounted therein and is set to about 45 mm herein. Therefore, this is three times 15 mm representing a longitudinal direction of the rectangular size of the mirror device 6. That is, assuming that a plurality of the pattern projecting apparatuses 3 are arranged to scan the substrate in parallel, lithography can be performed in a width of 15 mm and at an interval of 45 mm and, unless scanning is carried out at least three times, the whole surface cannot be written.

In view of this, in this invention, the mask substrate 1 is moved so that a plurality of the pattern projecting apparatuses 3 overlap each other. Specifically, by scanning the mask substrate 1 in a moving direction 5, it becomes possible to connect together exposure areas 4 caused by adjacent two luminous fluxes from the adjacent two pattern projecting apparatuses 3. By this, the whole surface of the mask substrate 1 can be written by scanning the mask substrate once. In FIG. 6, the exposure areas 4 are indicated by arrows and shown even outside the mask substrate 1. However, actually, the exposure is started after the mask substrate 1 has moved right below the mirror device projection areas.

Figure 8:
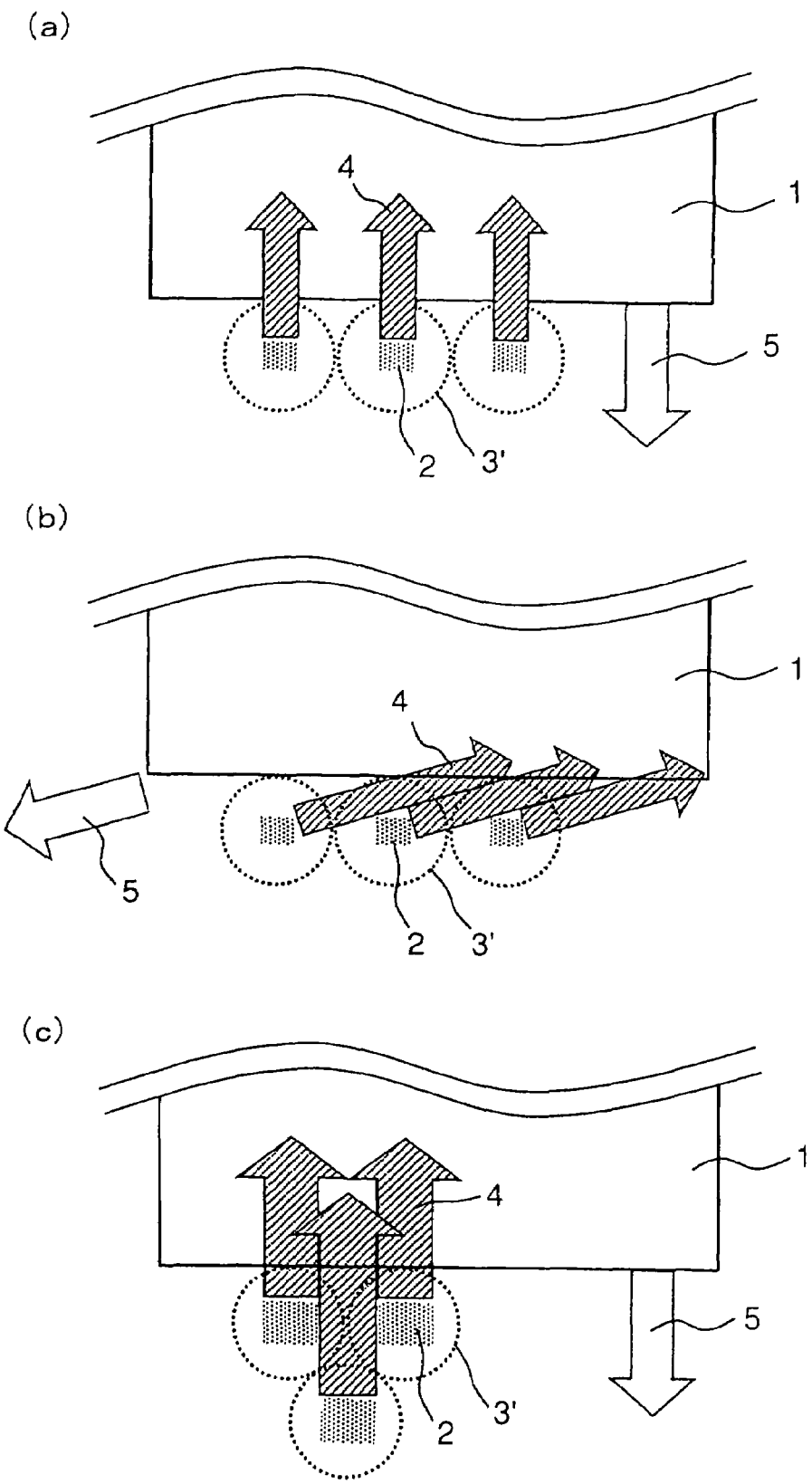
FIG. 8 is an explanatory diagram showing a conventional technique and techniques of this invention.

Herein, referring to FIG. 8, description will be given to a conventional lithography technique and lithography techniques of this invention in the case where three pattern projecting apparatuses 3 are used to pattern a mask substrate 1. In FIG. 8, (a) shows the conventional technique wherein luminous fluxes from the pattern projecting apparatuses 3 do not overlap each other with respect to a moving direction of the mask substrate 1. As a result, three exposure areas 4 are formed discretely by scanning the mask substrate 1 once. On the other hand, as shown in FIG. 8 at (b), when the mask substrate 1 is scanned obliquely like in a moving direction 5, three luminous fluxes partly overlap each other so that exposure areas 4 caused thereby are connected to each other, and therefore, the exposure can be performed with a wide width by one-time scanning. On the other hand, in the example shown in FIG. 8 at (c), each mirror device projection area 2 is large, i.e. ½ of the outer periphery 3' of the pattern projecting apparatus 3. In this case, two luminous fluxes from two sets of the pattern projecting apparatuses 3 overlap with each other with respect to the moving direction of the mask substrate 1. As a result, three exposure areas 4 are connected to each other.

As described above, this invention is characterized in that, by considering both the arrangement of the pattern projecting apparatuses and the moving direction of the mask substrate, the wide range can be written by one-time scanning.

In the mask lithography system 1000 in the embodiment shown in FIG. 6, 15 pattern projecting apparatuses 3 are actually used and these are arranged in contact with each other. It is preferable that these be fixed by a jig (not shown) made of a material, such as Zerodure or Inbar, having a low thermal expansion coefficient.

Figure 9:
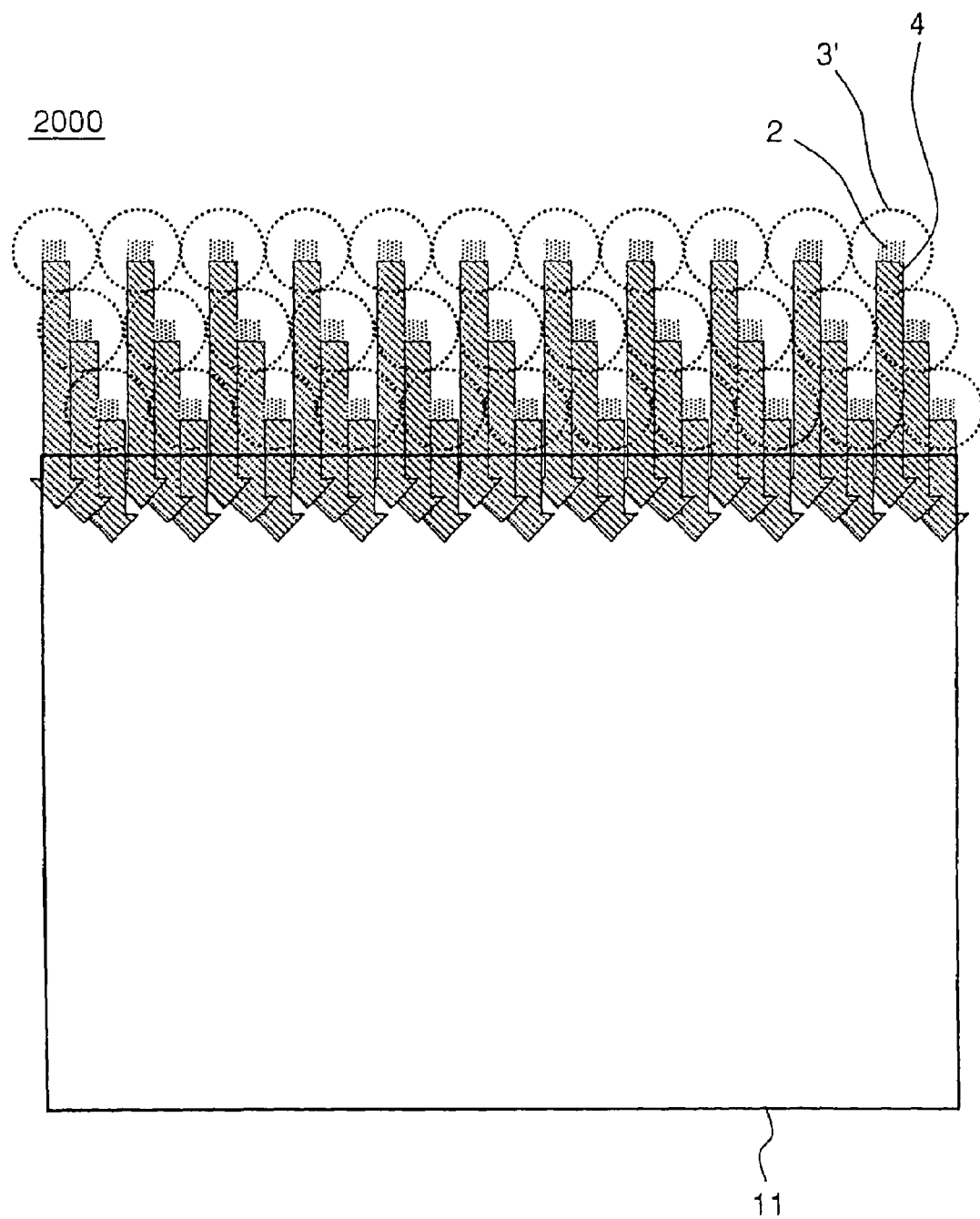
FIG. 9 is an explanatory diagram of still another embodiment of this invention.
Figure 10:
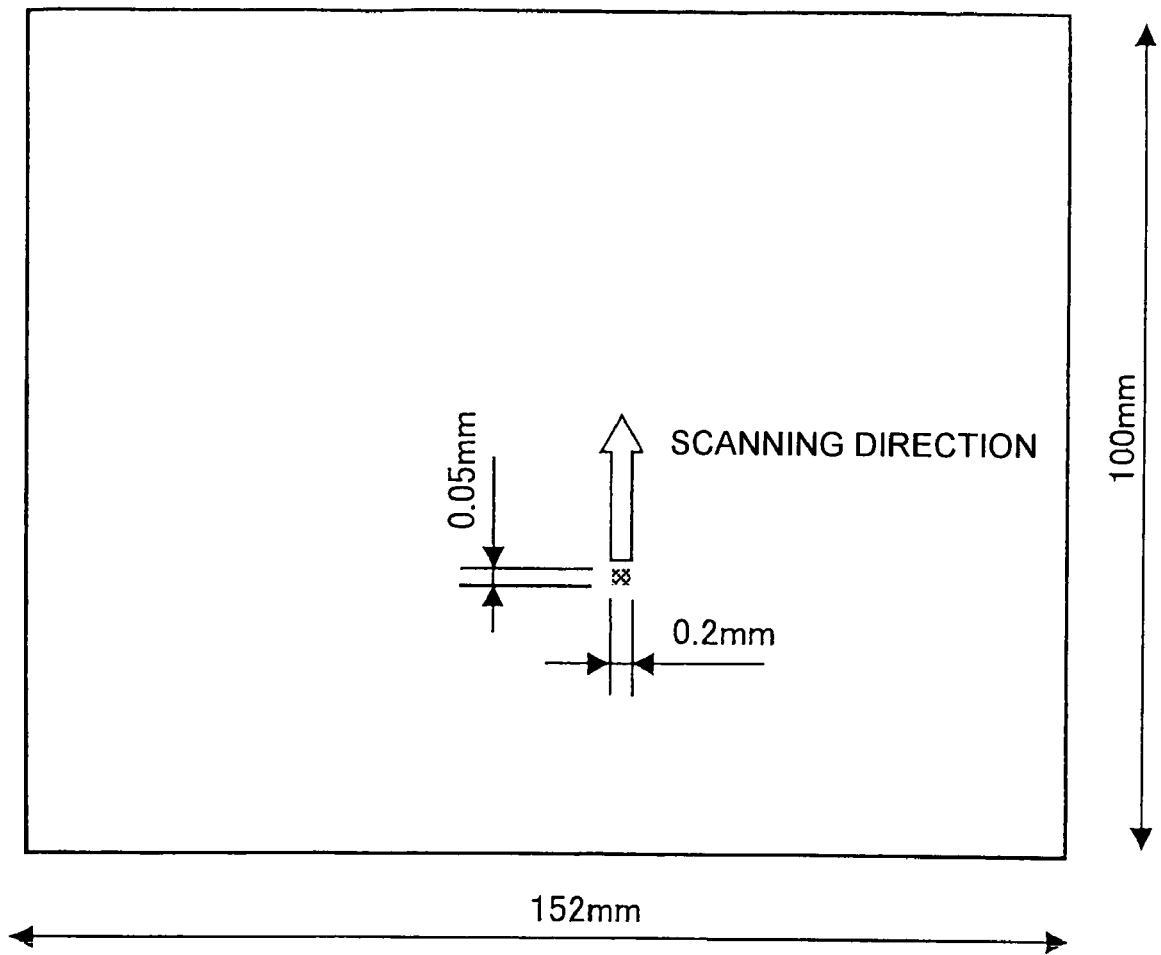
FIG. 10 is a diagram for explaining lithography performed by a conventional system.

Now, another embodiment of this invention will be described with reference to FIG. 9. FIG. 9 is an explanatory diagram of lithography by a mask lithography system 2000 which is adapted for delineating a mask substrate 11 larger than that in the embodiment shown in FIG. 6. In the mask lithography system 2000, a number of pattern projecting apparatuses 3, which are the same as those in the embodiment shown in FIG. 6, are arrayed in three stages as shown in the figure such that luminous fluxes overlap each other, and these are firmly fixed by a jig made of a material having a low thermal expansion coefficient. The width of each mirror device projection area 2 is 15 mm while the outer diameter of each pattern projecting apparatus 3 is 45 mm and, therefore, by arraying the pattern projecting apparatuses 3 in three stages with their center positions offset as shown in the figure, respective exposure areas 4 can be connected to each other.

As a feature of this embodiment, since the mask substrate 11 subjected to lithography is large, in the case where the pattern projecting apparatuses 3 are arranged in three stages as shown in the figure, the distance scanned, without exposure, by the pattern projecting apparatus 3 farthest from the mask substrate 11 is small as compared with the width (length in a longitudinal direction in FIG. 9) of the mask substrate 11. Therefore, a time required for delineating the whole mask substrate 11 does not become long as compared with a time obtained by simply dividing the width of the mask substrate 11 by a scan speed. Apart from it, since it is not necessary to step the mask substrate as in the conventional laser-beam lithography system, a time required for many steps can be saved and therefore a mask lithography time can also be shortened.

On the other hand, as shown in FIG. 7, it is one constitutional element of the pattern projecting apparatus 3 used in this invention that the mirror device projection area 2 is formed as the aggregate of the microspots by the use of the microlens array 8. By this, the size of the mirror device projection area 2 itself can be increased to about ½ to ⅓ as compared with the outer periphery or the width of the pattern projecting apparatus 3.

Figure 11:
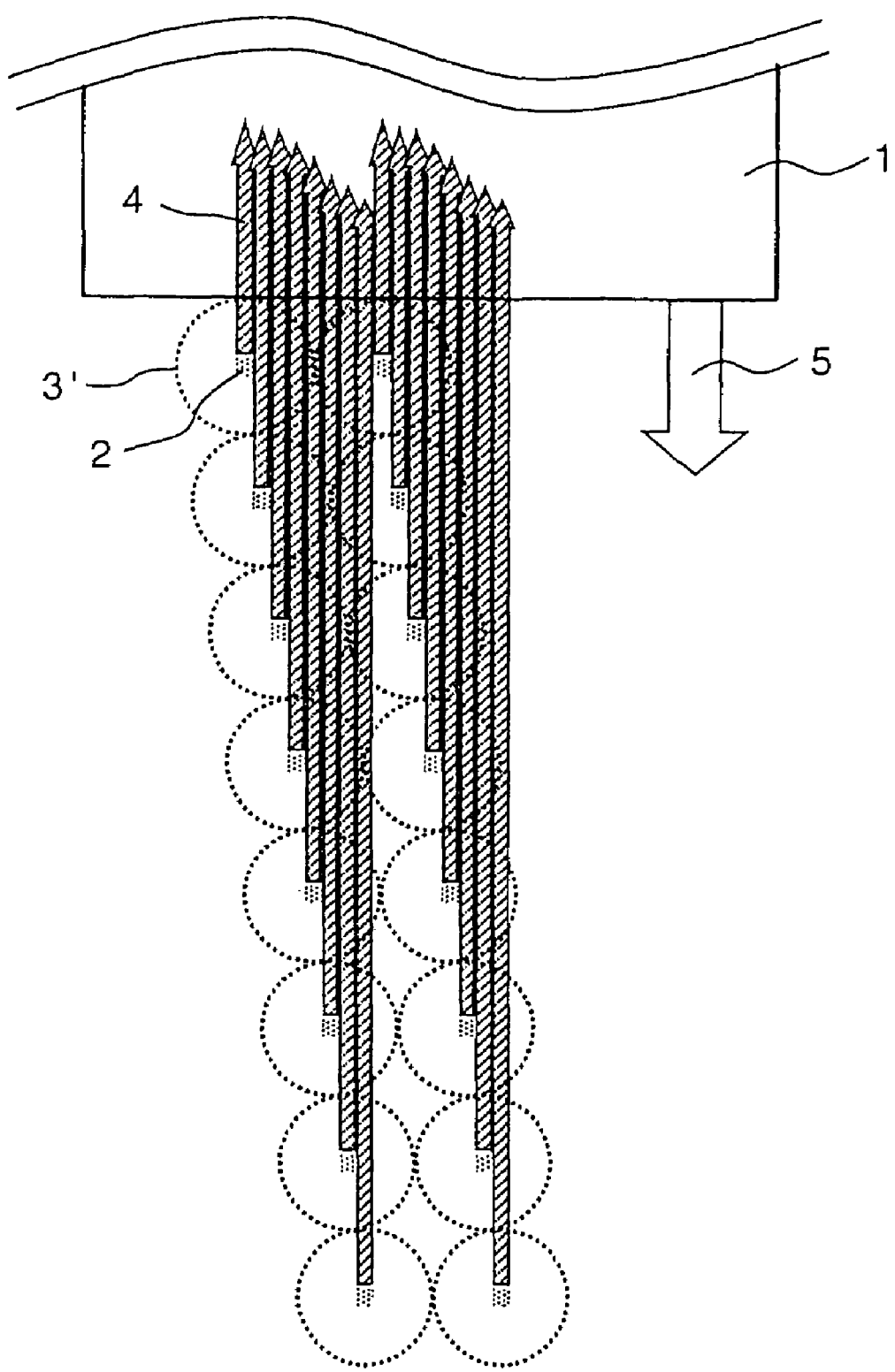
FIG. 11 is a diagram for explaining a lithography operation assuming that a plurality of conventional apparatuses are used.

Herein, description will be given on the assumption that the microlens array is not used like in the conventional laser-beam lithography system. In this case, in a configuration where a mirror device is simply reduced, as described before, it is necessary to provide a high reduction ratio of about 1/160 and therefore each mirror device projection area 2 itself becomes small as shown in an explanatory diagram of FIG. 11. Even in this case, if a mask substrate 1 is scanned in a moving direction 5 so that adjacent pattern projecting apparatuses 3 overlap each other, respective exposure areas 4 can be connected to each other.

However, since the number of the pattern projecting apparatuses 3 that are overlapped with respect to the moving direction 5 of the mask substrate 1 increases, the scan distance necessary for lithography the whole surface of the mask substrate 1 increases so that a lithography time is prolonged. Further, a large number of pattern projecting apparatuses 3 become necessary. That is, in the figure, each mirror device projection area 2 is shown to be ⅛ of the outer periphery 3' of the pattern projecting apparatus 3 and, as a result, eight pattern projecting apparatuses 3 are required only for exposing the same width as the outer periphery 3' of the pattern projecting apparatus 3.

As described above, according to the mask lithography system of this invention, by the use of particularly the microlens array, the whole surface of the mask can be exposed without causing the number of the pattern projecting apparatuses to become so many and without performing excessive scanning with respect to the mask substrate.

In this invention, one set of a pattern projecting apparatus 3 or one pattern projecting apparatus 3 represents a portion where laser light proceeding from the mirror device passes through the microlens array so as to be condensed to small spots and then projected through the lenses 10*a* and 10*b*. It does not matter whether a plurality of sets of such portions are individually cased with bodies, respectively, or are collectively cased with a single body.

As described above, according to the systems and methods in accordance with this invention, when lithography a mask, a large number of patterns corresponding to part of the intended entire mask pattern can be written in an instant and further the respective partial patterns can be moved at a high speed, and therefore, the entire mask pattern can be written in several minutes so that a mask lithography time is extremely shortened. As a result, 20 to 30 masks required for manufacturing normal semiconductor can be all written within a day so that the time can be shortened to $1/10$ or less as compared with a conventional one. Further, the mask writing cost can be largely reduced accordingly.

Moreover, according to the system, since a mask can be written in a short period of time and at a low cost, it is highly effective to use the system for manufacturing a mask for EUVL (Extremely Ultraviolet Lithography) about which there is concern that an expensive mask is deteriorated in a short period of time. That is, in EUVL, X-ray having a wavelength of 13.5 nm is used as exposure light but, since photon energy is quite high at such a short wavelength, a mask is damaged and required to be replaced in a short period of time. In that event, if masks are frequently fabricated again by the use of the conventional mask lithography system, the manufacture of semiconductor is stopped over the long term on every such occasion.

On the other hand, according to the mask writing system of this invention, since the lithography speed is extremely fast, even all masks can be manufactured in a short period of time and, consequently, the masks can be manufactured at a low cost. Therefore, even if the masks are frequently replaced, there arises no problem in terms of cost and production schedule.

Further, according to the mask lithography system of this invention, since it becomes possible to write the whole surface of a mask by scanning a mask substrate once, connection exposure can be carried out quite accurately.

INDUSTRIAL APPLICABILITY

According to this invention, various masks for use in semiconductor device manufacture can be written accurately and quickly.

The invention claimed is:

1. A method of writing a mask for use in manufacturing a semiconductor device, comprising:
   using a mask pattern projecting apparatus using light control elements arranged in a two-dimensional array;
   controlling said light control elements based on mask pattern data to thereby enlarge a mask pattern into a first mask pattern which is enlarged in comparison with the mask pattern; and
   reducing the first mask pattern into a reduced second mask pattern reduced in size in comparison with the first mask pattern by using a reduction-projection optical apparatus.

2. A method of writing a mask for use in manufacturing a semiconductor device according to claim 1, characterized by using micromirrors arranged in a two-dimensional array as said light control elements.

3. A method of writing a mask for use in manufacturing a semiconductor device according to claim 1, characterized by using self-light-emitting elements as said light control elements.

4. A method of writing a mask for use in manufacturing a semiconductor device according to claim 1, characterized by using a liquid crystal display element or a reflector display element as said light control elements.

5. A method of writing a mask for use in manufacturing a semiconductor device according to claim 1, characterized in that said first mask pattern is a spatial pattern.

6. A method of writing a mask for use in manufacturing a semiconductor device according to claim 1, characterized by obtaining a proximity mask on the basis of said second mask pattern.

7. A method of writing a mask for use in manufacturing a semiconductor device, comprising:
   using a mask pattern projecting apparatus using light control elements arranged in a two-dimensional array;
   controlling said light control elements based on mask pattern data to enlarge a mask pattern into a first mask pattern which is enlarged in size in comparison with the mask pattern;
   reducing the first mask pattern into a reduced second mask pattern reduced in size in comparison with the first mask pattern by using a first reduction-projection optical apparatus; and
   further reducing the reduced second mask pattern into a further reduced third mask pattern by using a second reduction-projection optical apparatus.

8. A method of writing a mask for use in manufacturing a semiconductor device according to claim 7, characterized by obtaining a proximity mask on the basis of said third mask pattern.

9. A method of writing a mask for use in manufacturing a semiconductor device according to claim 7, characterized by using micromirrors arranged in a two-dimensional array as said light control elements.

10. A method of writing a mask for use in manufacturing a semiconductor device according to claim 7, characterized by using self-light-emitting elements as said light control elements.

11. A method of writing a mask for use in manufacturing a semiconductor device according to claim 7, characterized by using a liquid crystal display element or a reflector display element as said light control elements.

12. A method of writing a mask for use in manufacturing a semiconductor device according to claim 7, characterized in that said first mask pattern is a spatial pattern.

13. A system for writing a mask for use in manufacturing a semiconductor device, comprising:
   a mask pattern projecting apparatus using light control elements arranged in a two-dimensional array by controlling said light control elements based on mask pattern data to thereby enlarge a mask pattern into a first mask pattern enlarged in size in comparison with the mask pattern; and a reduction-projection optical apparatus for reducing said first mask pattern into a reduced second mask pattern which is reduced in size in comparison with the first mask pattern.

14. A system for writing a mask for use in manufacturing a semiconductor device according to claim 13, characterized by using micromirrors arranged in a two-dimensional array as said light control elements.

15. A system for writing a mask for use in manufacturing a semiconductor device according to claim 13, characterized by using self-light-emitting elements as said light control elements.

16. A system for writing a mask for use in manufacturing a semiconductor device according to claim 13, characterized by using a liquid crystal display element as said light control elements.

17. A system for writing a mask for use in manufacturing a semiconductor device, comprising:

a mask pattern projecting apparatus using light control elements arranged in a two-dimensional array by controlling said light control elements based on mask pattern data to thereby enlarge a mask pattern into a first mask pattern enlarged in size in comparison with the mask pattern;

a first reduction-projection optical apparatus for reducing said first mask pattern into a reduced second mask pattern which is reduced in size in comparison with the first mask pattern; and a second reduction-projection optical apparatus for further reducing the reduced second mask pattern into a further reduced third mask pattern which is further reduced in size in comparison with the reduced second mask pattern.

18. A system for writing a mask for use in manufacturing a semiconductor device according to claim 17, characterized by using micromirrors arranged in a two-dimensional array as said light control elements.

19. A system for writing a mask for use in manufacturing a semiconductor device according to claim 17, characterized by using self-light-emitting elements as said light control elements.

20. A system for writing a mask for use in manufacturing a semiconductor device according to claim 17, characterized by using a liquid crystal display element as said light control elements.

* * * * *